US012584221B2

(12) United States Patent
Tuominen et al.

(10) Patent No.: US 12,584,221 B2
(45) Date of Patent: Mar. 24, 2026

(54) METHODS AND SYSTEMS FOR DEPOSITING A LAYER

(71) Applicant: ASM IP Holding B.V., Almere (NL)

(72) Inventors: Marko Tuominen, Helsinki (FI); Viljami Pore, Helsinki (FI)

(73) Assignee: ASM IP Holding B.V., Almere (NL)

( * ) Notice: Subject to any disclaimer, the term of this patent is extended or adjusted under 35 U.S.C. 154(b) by 401 days.

(21) Appl. No.: 18/132,593

(22) Filed: Apr. 10, 2023

(65) Prior Publication Data

US 2023/0243036 A1 Aug. 3, 2023

Related U.S. Application Data

(62) Division of application No. 17/580,832, filed on Jan. 21, 2022, now Pat. No. 11,643,726.

(60) Provisional application No. 63/141,822, filed on Jan. 26, 2021.

(51) Int. Cl.

*C23C 16/458* (2006.01)
*C23C 16/455* (2006.01)
*C23C 16/509* (2006.01)
*C23C 16/517* (2006.01)
*C23C 16/52* (2006.01)
*C23C 16/56* (2006.01)

(52) U.S. Cl.

CPC .... *C23C 16/4586* (2013.01); *C23C 16/45536* (2013.01); *C23C 16/45565* (2013.01); *C23C 16/4557* (2013.01); *C23C 16/509* (2013.01); *C23C 16/517* (2013.01); *C23C 16/52* (2013.01); *C23C 16/56* (2013.01)

(58) Field of Classification Search

CPC .......... C23C 16/4586; C23C 16/45536; C23C 16/45565; C23C 16/4557; C23C 16/509; C23C 16/517; C23C 16/52; C23C 16/56; C23C 14/24; C23C 14/5826; C23C 14/5846; C23C 18/143; C23C 18/145; C23C 16/45544; C23C 16/46; C23C 16/463; C23C 16/48; C23C 16/505; B05D 3/0263; B05D 3/06; B05D 3/067; B05D 3/147; B05D 1/60; H01L 21/0228

See application file for complete search history.

(56) References Cited

U.S. PATENT DOCUMENTS 5,595,606 A * 1/1997 Fujikawa .......... C23C 16/45572 118/724
6,387,182 B1 5/2002 Horie et al.
6,849,241 B2 2/2005 Dauelsberg et al.
6,884,296 B2 * 4/2005 Basceri ............. C23C 16/45514 156/345.33
8,383,525 B2 * 2/2013 Raisanen .............. C23C 16/405 438/778

(Continued)

FOREIGN PATENT DOCUMENTS

CN 118186364 A * 6/2024 ......... H01L 21/0262
JP H024970 A * 1/1990

(Continued)

*Primary Examiner* — Jeffrie R Lund
(74) *Attorney, Agent, or Firm* — Snell & Wilmer L.L.P.

(57) ABSTRACT

Systems for depositing materials and related methods are described. The systems allow condensing or depositing a precursor on a substrate, and then curing condensed or deposited precursor to form a layer.

13 Claims, 6 Drawing Sheets

(56) References Cited

U.S. PATENT DOCUMENTS

| | | | | |
|---|---|---|---|---|
| 8,668,775 | B2 * | 3/2014 | Moshtagh | C23C 16/45589 118/724 |
| 8,933,375 | B2 | 1/2015 | Dunn et al. | |
| 9,034,142 | B2 * | 5/2015 | Bartlett | C23C 16/4557 156/345.33 |
| 9,353,441 | B2 | 5/2016 | Chung et al. | |
| 9,899,210 | B2 * | 2/2018 | Guo | C23C 16/45565 |
| 10,053,774 | B2 | 8/2018 | Tolle et al. | |
| 11,306,395 | B2 * | 4/2022 | Shero | C23C 16/52 |
| 11,574,815 | B1 * | 2/2023 | Amano | C23C 16/4404 |
| 11,643,726 | B2 * | 5/2023 | Tuominen | C23C 14/5846 427/295 |
| 11,814,747 | B2 | 11/2023 | Tolle et al. | |
| 11,976,361 | B2 * | 5/2024 | Shero | C23C 16/4401 |
| 2001/0054388 | A1 * | 12/2001 | Qian | C23C 16/56 427/539 |
| 2006/0096541 | A1 | 5/2006 | Seo et al. | |
| 2008/0076266 | A1 * | 3/2008 | Fukazawa | H01L 21/3105 257/E21.279 |
| 2009/0095220 | A1 | 4/2009 | Heinhold et al. | |
| 2010/0304571 | A1 | 12/2010 | Larson et al. | |
| 2012/0161405 | A1 * | 6/2012 | Mohn | H01L 21/67109 279/142 |
| 2014/0061324 | A1 * | 3/2014 | Mohn | H01J 37/3244 239/590 |
| 2015/0167160 | A1 | 6/2015 | Chen et al. | |
| 2015/0316857 | A1 * | 11/2015 | Berry, III | H01L 21/67207 355/30 |
| 2016/0056032 | A1 * | 2/2016 | Baldasseroni | C23C 16/45527 438/778 |
| 2019/0040529 | A1 | 2/2019 | Verbaas et al. | |
| 2019/0122872 | A1 * | 4/2019 | Ghosh | C23C 16/4408 |
| 2019/0204029 | A1 | 7/2019 | Tanabe | |
| 2020/0010957 | A1 | 1/2020 | Chen et al. | |
| 2020/0171536 | A1 * | 6/2020 | Seamons | H01L 21/02216 |
| 2022/0235460 | A1 * | 7/2022 | Tuominen | C23C 16/509 |
| 2023/0243036 | A1 * | 8/2023 | Tuominen | C23C 14/5846 427/295 |
| 2024/0387226 | A1 * | 11/2024 | Miller | C23C 16/45544 |

FOREIGN PATENT DOCUMENTS

| | | | | |
|---|---|---|---|---|
| JP | 2004252262 | A | 9/2004 | |
| JP | 2006059915 | A | 3/2006 | |
| JP | 2005228972 | A | 5/2010 | |
| WO | WO-2024059012 | A1 * | 3/2024 | C23C 16/45544 |
| WO | WO-2024072670 | A1 * | 4/2024 | C23C 16/45561 |

* cited by examiner

METHODS AND SYSTEMS FOR DEPOSITING A LAYER

CROSS-REFERENCE TO RELATED APPLICATIONS

This application is a division of, and claims priority to, U.S. patent application Ser. No. 17/580,832 filed Jan. 21, 2022, titled METHODS FOR FORMING A LAYER COMPRISING A CONDENSING AND A CURING STEP; which claims the benefit of U.S. Provisional Patent Application Ser. No. 63/141,822 filed Jan. 26, 2021 titled METHODS AND SYSTEMS FOR DEPOSITING A LAYER, the disclosures of which are hereby incorporated by reference in its entirety.

FIELD OF INVENTION

The present disclosure generally relates to systems and methods suitable for depositing a layer on a substrate.

BACKGROUND OF THE DISCLOSURE

Vapor phase deposition processes are ubiquitously used in semiconductor device manufacture. Various deposition processes require a material to be deposited. This is the case, for example, in processes for filling a recess, trench, or gap in a substrate. Other processes in which a material is to be deposited include depositions of dielectric materials. However, it continues to be challenging to deposit various materials, especially when tradeoffs need to be made between repeatability, layer quality, and process speed. Therefore, there remains a need for improved methods and devices for depositing a material.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Described herein is a system that comprises a reaction chamber, a precursor source, a gas injection system, and a curing unit. The reaction chamber comprises a substrate support which in turn comprises a substrate cooling unit. The precursor source is arranged for introducing a precursor into the reaction chamber via a gas injection system which is in fluid connection with the reaction chamber. The precursor source comprises a precursor source heater. The gas injection system heater is arranged for heating the gas injection system.

In some embodiments, the gas injection system comprises a showerhead injector. In such embodiments, the showerhead injector comprises a showerhead injector heater.

In some embodiments, the curing unit comprises a lower electrode and an upper electrode. The lower electrode is comprised in the substrate support. The upper electrode is comprised in the showerhead injector. In such embodiments, the system further comprises a radio frequency power source which is arranged for generating a radio frequency power waveform. The radio frequency power source is electrically connected to one of the lower electrode and the upper electrode.

In some embodiments, the curing unit comprises an infrared source.

In some embodiments, the curing unit comprises a UV source.

In some embodiments, the curing unit comprises a microwave source.

In some embodiments, the curing unit comprises a remote plasma source.

In some embodiments, one or more mesh plates are positioned between the remote plasma source and the substrate support.

In some embodiments, the system further comprises a controller. The controller comprises a gas flow control unit, a precursor source temperature control unit, a gas injection system temperature control unit, a substrate support temperature control unit, and a curing unit control unit. The gas flow control unit is arranged to control gas flow into the gas injection system. The precursor source temperature control unit is arranged to maintain the precursor source at a pre-determined precursor source temperature. The gas injection system temperature control unit is arranged to maintain the gas injection system at a pre-determined gas injection system temperature. The gas injection system temperature is higher than the precursor source temperature. The substrate support temperature control unit is arranged to maintain the substrate support at a pre-determined substrate support temperature. The substrate support temperature is lower than the precursor source temperature. The curing unit control unit is arranged for controlling the operation, i.e. the functioning, of the curing unit.

In some embodiments, the system further comprises a substrate heating unit. In some embodiments, the substrate heating unit is comprised in the substrate support.

Further described herein is a method for forming a layer on a substrate. The method comprises a step of providing a system comprising a precursor source. The system further comprises a gas injection system, a reaction chamber, and a curing unit. The precursor source comprises a precursor. The reaction chamber comprises a substrate support. The method further comprises maintaining the precursor source at a precursor source temperature, and maintaining the gas injection system at a gas injection system temperature. The gas injection system temperature is higher than the precursor source temperature. The method further comprises maintaining the substrate support at a substrate support temperature. The substrate support temperature is lower than the precursor source temperature. The method further comprises positioning a substrate on the substrate support. Then, the method comprises providing a precursor to the reaction chamber. It shall be understood that the precursor is provided to the reaction chamber from the precursor source and via the gas injection system. Thus, the precursor is condensed or deposited on the substrate to form a condensed or deposited precursor. Then, the method comprises curing the condensed or deposited precursor by means of the curing unit.

In some embodiments, the gas injection system comprises a showerhead injector. The showerhead injector comprises a showerhead injector heater. In such embodiments, the method further comprises maintaining the showerhead injector at a showerhead injector temperature by means of the showerhead injector heater. It shall be understood that the showerhead injector temperature is higher than or equal to the gas injection system temperature.

In some embodiments, the curing unit comprises a lower electrode and an upper electrode. The lower electrode is comprised in the substrate support. The upper electrode is comprised the showerhead injector. In such embodiments, the curing unit further comprises a radio frequency power source arranged for generating a radio frequency power waveform. The radio frequency power source is electrically connected to one of the lower electrode and the upper electrode. Also, in such embodiments, curing the condensed or deposited precursor comprises generating a plasma between the upper electrode and the lower electrode.

In some embodiments, the curing unit comprises an infrared source. In such embodiments, curing the condensed or deposited precursor comprises exposing the precursor to infrared radiation.

In some embodiments, the curing unit comprises an ultraviolet radiation source. In such embodiments, curing the condensed or deposited precursor comprises exposing the precursor to ultraviolet radiation.

In some embodiments, the curing unit comprises a remote plasma source. In such embodiments, curing the condensed or deposited precursor comprises exposing the condensed or deposited precursor to one or more excited species.

In some embodiments, the curing unit comprises a remote plasma source, one or more mesh plates are positioned between the remote plasma source and the substrate support, and curing the condensed or deposited precursor comprises exposing the precursor to radicals.

In some embodiments, the precursor comprises a boron precursor, and curing the condensed or deposited precursor comprises exposing the precursor to a reactant.

In some embodiments, the method comprises executing a plurality of deposition cycles. A deposition cycle comprises a precursor pulse and a curing pulse. A precursor pulse comprises providing the precursor to the reaction chamber. The curing pulse comprises curing the condensed or deposited precursor.

In some embodiments, curing the precursor further comprises providing a reactant to the reaction chamber.

Further described herein is a method for forming a layer on a substrate. The method comprises a step of providing a system comprising a first precursor source comprising a first precursor, a second precursor source comprising a second precursor, a gas injection system, a reaction chamber comprising a substrate support, and a curing unit. The method further comprises maintaining the first precursor source at a first precursor source temperature. The method further comprises maintaining the second precursor source at a second precursor source temperature. The method further comprises maintaining the gas injection system at a gas injection system temperature. The gas injection system temperature is higher than the first precursor source temperature. The gas injection system temperature is higher than the second precursor source temperature. The method further comprises maintaining the substrate support at a substrate support temperature. The substrate support temperature is lower than the first precursor source temperature. The substrate support temperature is lower than the second precursor source temperature. The method further comprises positioning a substrate on the substrate support. The method further comprises executing one or more first cycles. A first cycle comprises providing the first precursor, from the first precursor source, via the gas injection system, to the reaction chamber. Thus, the first precursor is condensed or deposited on the substrate to form a condensed or deposited first precursor. A first cycle further comprises curing the condensed or deposited first precursor by means of the curing unit. The method further comprises executing one or more second cycles. A second cycle comprises providing the second precursor, from the second precursor source, via the gas injection system, to the reaction chamber. Thus, the second precursor is condensed or deposited on the substrate to form a condensed or deposited second precursor. The condensed or deposited second precursor is then cured by means of the curing unit.

In some embodiments, the method comprises two or more super cycles. A super cycle comprises executing one or more first cycles and executing one or more second cycles.

In some embodiments, a presently employed method is carried out in a system as described herein.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
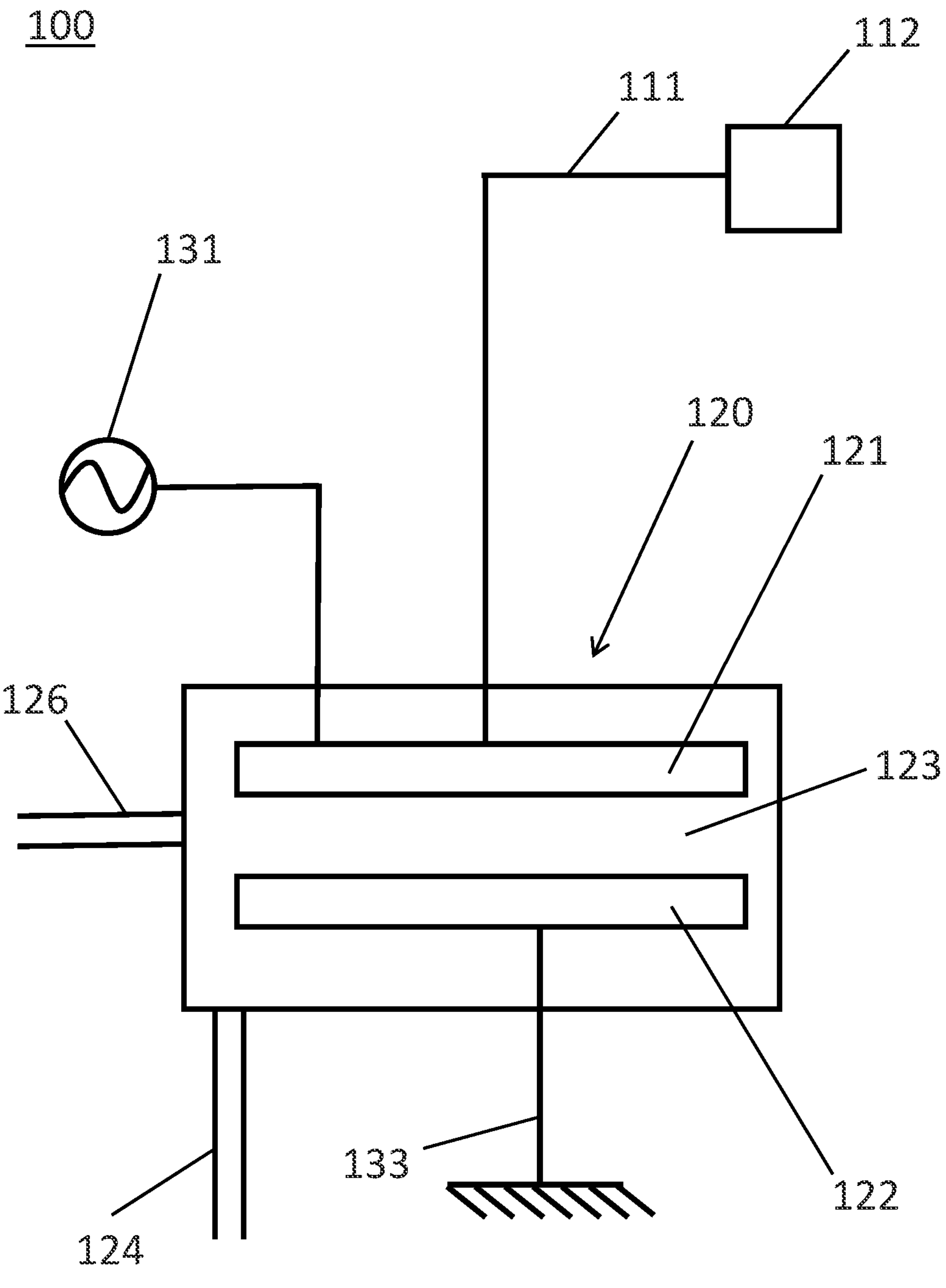
FIG. 1 shows an embodiment of a system (100) as disclosed herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

Described herein are methods and related systems that can be used, for example, for depositing materials in a repeatable way.

In some embodiments, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a noble gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. Alternatively, a "reactant" may refer to a compound that reacts with a surface of a substrate to form a volatile reaction product. Thus, "reactants" may be used in both deposition processes or etching processes, or both.

In some embodiments, "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material. Exemplary substrates include wafers such as silicon wafers, e.g. 200 mm wafers, 300 mm wafers, or 450 mm wafers.

In some embodiments, "film" and/or "layer" can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules, or layers consisting of isolated atoms and/or molecules. A film or layer may comprise material or a layer with pinholes, which may or may not be continuous.

In some embodiments, "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

In some embodiments, "atomic layer deposition" (ALD) can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy, molecular beam epitaxy (MBE), gas source MBE, organometallic MBE, and chemical beam epitaxy, when performed with alternating pulses of precursor(s)/reactive gas(es), and purge (e.g., inert carrier) gas(es).

The term "dew point" as used herein refers to the temperature at which the precursor condenses, i.e. the temperature at which the precursor transitions from the gas phase to the liquid phase. The skilled person understand that the dew point of a precursor depends on pressure. Thus, it shall be understood that the term "dew point" when used herein, refers to the dew point of the precursor at the pressure in the reaction chamber.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the term "comprising" indicates that the embodiment it refers to includes those features, but it does not exclude the presence of other features, as long as they do not render the corresponding embodiment unworkable. On the other hand, "consisting of" indicates that no further features are present in the embodiment concerned apart from the ones following said wording, except optional further features which do not materially affect the essential characteristics of the corresponding embodiment. It shall be understood that the term "comprising" includes the meaning of the term "consisting of."

Described herein is a system for depositing a layer. The system comprises a reaction chamber comprising a substrate support, a substrate cooling unit, a precursor source, a precursor source heater, a gas injection system, a gas injection system heater, and a curing unit.

The reaction chamber comprises the substrate support. The substrate support suitably provides mechanical support for a substrate during a deposition process. Suitable substrates include semiconductor wafers, e.g. silicon wafers such as p-type silicon wafers. The substrate can have any dimension. An exemplary substrate is circular and has a diameter of 200 mm, 300 mm, or 450 mm.

The substrate support comprises the substrate cooling unit. During normal operation, the substrate can be brought to a desired process temperature by means of heated process gasses, and/or by heat from the gas injection system and/or the precursor source. Therefore, a substrate heater is not strictly necessary. Nevertheless, in some embodiments, the substrate support further comprises a substrate heater. Accordingly, a substrate can be heated rapidly to a desired process temperature. Once the substrate is at that process temperature, the substrate cooler can be used to ensure that the substrate's temperature does not exceed a desired process temperature.

Suitable substrate coolers include various heat exchangers as are known in the art. For example, a substrate cooler can comprise a meandering, cooling-fluid containing duct comprised in the substrate support. Additionally or alternatively, the substrate cooler can comprise a network of interconnected cooling ducts comprised in the substrate support. Additionally or alternatively, the substrate cooler can comprise a Peltier cooling element.

In some embodiment, the system is configured for maintaining the substrate at a temperature of at least −75° C. to at most 600° C., or at a temperature of at least 0° C. to at most 400° C., or at a temperature of at least 25° C. to at most 200° C., or at a temperature of at least 50° C. to at most 100° C.

The precursor source is arranged for providing a precursor, and optionally a carrier gas. A gas injection system is in fluid connection with the precursor source and with the reaction chamber. The gas injection system is arranged for providing the precursor and optionally the carrier gas from the precursor source to the reaction chamber. The precursor source comprises a precursor source heater that can, during normal use, be suitably arranged for maintaining the precursor source at a pre-determined temperature, i.e. at a pre-determined precursor source temperature.

As mentioned before, the gas injection system is arranged for providing the precursor and optionally a carrier gas from the precursor source to the reaction chamber. The gas injection system comprises a gas injection system heater. The gas injection system heater is arranged for heating the gas injection system.

Suitable gas injection systems include, in some embodiments, one or more pipes and/or gas manifolds. The gas injection system can comprise, for example, insulating heating jackets around the one or more pipes and/or gas manifolds. The heating jackets can comprise, for example, resistive heaters and/or pipes comprising a heating fluid.

In some embodiments, the gas injection system comprises one or more heated gas lines. In some embodiments, the heated gas lines are heated to a temperature which is below the temperature of a showerhead injector comprised in the system, and which is above the temperature of the substrate support. In some embodiments, the heated gas lines are heated to a temperature which is higher than the temperature of a precursor source comprised in the system. In some embodiments, the heated gas lines are heated to a temperature of at least 50° C. to at most 1000° C., or to a temperature of at least 100° C. to at most 600° C., or to a temperature of at least 150° C. to at most 400° C., e.g. to a temperature of 200° C. The heated gas lines may be heated, for example, by means of a heating jacket, for example a resistively heated heating jacket.

In some embodiments, the gas injection system comprises a showerhead injector. The showerhead injector can be suitably arranged parallel to the substrate support. The showerhead injector comprises a showerhead injector heater. In some embodiments, the showerhead injector heater comprises a plurality of pipes comprising a heating fluid. Additionally or alternatively, the showerhead injector heater can, in some embodiments, comprise a resistive heater.

The system further comprises a curing unit. The curing unit can be advantageously used to solidify and/or densify condensed or deposited precursor on the substrate. Various types of curing units can be employed.

In some embodiments, the curing unit comprises a lower electrode, an upper electrode, and a radio frequency power source. The lower electrode can be suitably comprised in the substrate support. The upper electrode can be suitable located in a showerhead injector as described herein. Alternatively, a showerhead injector or a part thereof can function as an upper electrode. The radio frequency power source is arranged for generating a radio frequency power waveform and is electrically connected to one of the lower electrode and the upper electrode. It shall be understood that the electrode which is not electrically connected to the radio frequency power source is electrically grounded by means of a ground. Thus, in some embodiments, the lower electrode is grounded and the radio frequency power source is electrically connected to the upper electrode. Alternatively, the lower electrode can be electrically connected to the radio frequency power source and the upper electrode can be grounded.

In some embodiments, the curing unit comprises an infrared source. The infrared source can, for example, comprise an infrared lamp disposed outside the reaction chamber that is in line of sight of the substrate, through a window in the reaction chamber's walls. It shall be understood that the window is at least partially transparent to infrared light. Suitably, the window can be heated, e.g. resistively heated. Alternatively, the window can be heated by the infrared source. Heating the window can advantageously prevent precursor condensation on the window.

In some embodiments, the curing unit comprises a UV source, i.e. an ultraviolet source. The UV source can, for example, comprise an ultraviolet lamp disposed outside the reaction chamber that is in line of sight of the substrate, through a window in the reaction chamber's walls. It shall be understood that the window is at least partially transparent to ultraviolet light. Suitably, the window can be heated, e.g. resistively heated. Alternatively, the window can be heated by the UV source. Heating the window can advantageously prevent precursor condensation on the window.

In some embodiments, the curing unit comprises a remote plasma source. The remote plasma source can, for example, comprise any one of a microwave plasma source, a capacitively coupled plasma source, and inductively coupled plasma source. Suitably, the remote plasma source can be positioned outside the reaction chamber. Alternatively, the remote plasma source can be located inside the reaction chamber. Optionally one or more mesh plates are positioned between the remote plasma source and the substrate support.

In some embodiments, the curing unit comprises a microwave source. Thus, in some embodiments, the presently described methods can comprise curing the condensed or deposited precursor by means of a microwave source. The microwave source can, for example, be positioned inside the reaction chamber or outside the reaction chamber. It shall be understood that when the microwave source is positioned outside of the reaction chamber, the microwave source is suitably in operational connection with the reaction chamber via a microwave guide.

In some embodiments, the system further comprises an exhaust for removing unused reactants and/or reaction products from the reaction chamber. The exhaust can suitably be in fluid connection with a gas evacuating means such as a pump, e.g. a turbo pump, and/or a cold trap. The gas evacuating means may or may not be comprised in the presently described systems.

In some embodiments, the system further comprises a wall heater. Thus, the walls of the reaction chamber can be heated, and the sticking coefficient of gasses on the reactor walls can be controlled, and precursor deposition or condensation on the reaction chamber walls can be avoided or reduced. Any chamber wall heater can be used including, but not limited to, wall heaters comprising one or more resistive heating elements or wall heaters comprising one or more pipes comprising a heating fluid. In some embodiments, the walls of the reaction chamber may be heated to a temperature of at least 50° C. to at most 1000° C., or to a temperature of at least 100° C. to at most 800° C., or to a temperature of at least 400° C. to at most 700° C., e.g. to a temperature of 600° C., e.g. to a temperature of 500° C. Thus, the temperature of the walls of the reaction chamber can be effectively controlled, and consequentially, the sticking coefficient of gasses such as precursors or reactants used in the reaction chamber can be controlled as well.

In some embodiments, the reaction chamber is insulated, e.g. by means of double wall insulation. Reaction chamber insulation can advantageously improve temperature control in the reaction chamber. Additionally or alternatively, reaction chamber insulation can reduce heat losses to the environment. In some embodiments, an outer surface of the reaction chamber can be cooled by means of a cooling jacket, e.g. by means of a cooling jacket comprising water.

The systems described herein may, in some embodiments, further comprise a load lock and/or a wafer handling system. Accordingly, when a wafer, e.g. a semiconductor wafer such as a silicon wafer, is used as a substrate, the substrate can be efficiently and optionally automatically moved from a loading station, i.e. load lock, to the reaction chamber.

In some embodiments, the system further comprising a hull that surrounds the reaction chamber. The hull can comprise, for example, a temperature-resistant material such as steel.

In some embodiments, the system further comprises a controller comprising a gas flow control unit, a precursor source temperature control unit, a gas injection system temperature control unit, a substrate support temperature control unit, and a curing unit control unit arranged for controlling the operation of the curing unit. The gas flow control unit is arranged to control gas flow into the gas injection system. The precursor source temperature control unit is arranged to maintain the precursor source at a pre-determined precursor source temperature. The gas injection temperature control unit is arranged to maintain the gas injection system at a pre-determined injection system temperature. The gas injection system temperature is higher than the precursor source temperature. The substrate support temperature control unit is arranged to maintain the substrate support at a pre-determined substrate support temperature. The substrate support temperature is lower than the precursor source temperature. The curing unit control unit can suitably control a switching mechanism for turning the curing unit off during steps of depositing or condensing the precursor on the substrate, and for turning the curing unit on during the curing steps.

In some embodiments, the substrate support temperature is lower than the dew point of the precursor at the pressure in the reaction chamber. Thus, a liquid precursor phase can be formed on the substrate support. The formation of a liquid phase can be particularly advantageous for filling narrow gaps or recesses.

In some embodiments, the substrate support is higher than the dew point of the precursor at the pressure in the reaction chamber, or the reaction chamber is at a pressure in which no liquid precursor phase is formed, such as at a very low pressure. In such embodiments, the precursor can form a solid phase on a substrate positioned on the cooled substrate support. That solid phase can then be cured as described elsewhere herein.

The controller can include modules such as a software or hardware component, e.g., a FPGA or ASIC, which performs certain tasks. It shall be understood that where the controller includes a software component to perform a certain task, the controller is programmed to perform that particular task. A module can advantageously be configured to reside on the addressable storage medium, i.e. memory, of the controller and can be configured to control, for example, any specific function of the system.

Further described herein is a method for depositing a layer on a substrate. The method comprises providing a system, for example a system as described herein. The system comprises a precursor source. The precursor source comprises a precursor. The system further comprises a gas injection system and a reaction chamber and a curing unit. The reaction chamber comprises a substrate support. The method further comprises maintaining the precursor source at a pre-determined precursor source temperature, maintaining the gas injection system at a pre-determined gas injection system temperature, and maintaining the substrate support at a pre-determined substrate support temperature. The gas injection system temperature is higher than the pre-determined source temperature, and the substrate support temperature is lower than the pre-determined precursor source temperature. The method further comprises positioning a substrate on the substrate support. The method further comprises providing a precursor, from the precursor source, via the gas injection system, to the reaction chamber. Optionally, the precursor is introduced into the reaction chamber by means of a carrier gas. Depending on the precursor in question, and depending on the pressure in the reaction chamber, the precursor is condensed or deposited on the substrate. Then, the condensed or deposited precursor is cured. Advantageously, the presently described methods can allow depositing very thin layers. In addition, they can allow precise thickness control of layers.

In some embodiments, the step of condensing or depositing the precursor on the substrate comprises closing an inlet valve comprised in the gas injection system and an outlet valve comprised in an exhaust of the reaction chamber. Thus, precursor introduced in the reaction chamber can be given a certain amount of time, e.g. from at least 0.1 seconds to at most 20 seconds, to condense or deposit on the substrate, without precursor flowing into and out of the reaction chamber, thus minimizing precursor consumption.

In some embodiments, the method comprises maintaining the reaction chamber at a pre-determined reaction chamber pressure.

In some embodiments, the reaction chamber pressure is sufficiently high, and the substrate support temperature is sufficiently low, to allow the precursor to form a condensed liquid phase on the substrate. The skilled artisan understands that the exact temperatures and pressures at which these conditions occur depends on the precursor used, and are trivially determined in practice. Thus, in some embodiments, the precursor has a dew point at the reaction chamber pressure which is lower than the precursor source temperature and which is higher than the substrate support temperature. Accordingly, the precursor condenses on the substrate to form a condensed precursor. The condensed precursor is a liquid.

In some embodiments, the reaction chamber pressure is sufficiently low, and the substrate support temperature is sufficiently high, for the precursor to directly transition from the gas phase to the solid phase. In such embodiments, the precursor is deposited on the substrate to form a deposited precursor. The deposited precursor is a solid. The skilled artisan understands that the exact temperatures and pressures at which these conditions occur depends on the precursor used, and are trivially determined in practice.

In some embodiments, the substrate support temperature is from at least −20° C. to at most 40° C., the precursor source temperature is from at least 10° C. to at most 100° C., and the gas injection system temperature is from at least 30° C. to at most 150° C., with the proviso that the substrate support temperature is lower than the precursor source temperature, and the precursor source temperature is lower than the gas injection system temperature.

In some embodiments, the substrate support temperature is at least 1° C. lower than the precursor source temperature. In some embodiments, the substrate support temperature is at least 2° C. lower than the precursor source temperature. In some embodiments, the substrate support temperature is at least 5° C. lower than the precursor source temperature. In some embodiments, the substrate support temperature is at least 10° C. lower than the precursor source temperature. In some embodiments, the substrate support temperature is at least 20° C. lower than the precursor source temperature. In some embodiments, the substrate support temperature is at least 50° C. lower than the precursor source temperature.

In some embodiments, the precursor source temperature is at least 1° C. lower than the gas injection system temperature. In some embodiments, the precursor source temperature is at least 2° C. lower than the gas injection system temperature. In some embodiments, the precursor source temperature is at least 5° C. lower than the gas injection system temperature. In some embodiments, the precursor source temperature is at least 10° C. lower than the gas injection system temperature. In some embodiments, the precursor source temperature is at least 20° C. lower than the gas injection system temperature. In some embodiments, the precursor source temperature is at least 50° C. lower than the gas injection system temperature.

In some embodiments, the temperature of the gas injection system continuously increases from the precursor source to the reaction chamber. In other words, there can be a temperature gradient in the gas injection system. It shall be understood that in such embodiments, the term "gas injection system temperature" refers to a temperature range spanning from the lowest temperature in the gas injection system to the highest temperature in the gas injection system.

In some embodiments, the method employs a system in which the gas injection system comprises a showerhead injector. The showerhead injector can, in some embodiments, be arranged substantially parallel to the substrate support. The showerhead injector comprises a showerhead injector heater. In such embodiments, the method further comprises maintaining the showerhead injector at a showerhead injector temperature by means of the showerhead injector heater. The showerhead injector heater can maintain the showerhead injector at a showerhead injector temperature that can be higher than or equal to the gas injection system temperature. In some embodiments, the gas injection system temperature gradually increases from the precursor source temperature near the precursor source to the showerhead injector temperature near the showerhead injector.

In some embodiments, the curing unit comprises a lower electrode and an upper electrode. The lower electrode is comprised in the substrate support. The upper electrode is comprised the showerhead injector. In such embodiments, the curing unit further comprises a radio frequency power source arranged for generating a radio frequency power waveform. The radio frequency power source is electrically connected to one of the lower electrode and the upper electrode. It shall be understood that the electrode which is not electrically connected to the radio frequency power source is electrically grounded. In such embodiments, curing the condensed or deposited precursor comprises generating a plasma, i.e. a capacitively coupled plasma, between the upper electrode and the lower electrode.

In some embodiments, the plasma is continuously generated in the reaction chamber. Alternatively, the plasma can be a pulsed plasma comprising a sequence of plasma on and plasma off pulses. In other words, the plasma can be an intermittent plasma.

It shall be understood that generating a plasma in the reaction chamber comprises providing a plasma gas to the reaction chamber. Suitable plasma gasses include nitrogen, hydrogen, noble gasses such as He, Ne, and Ar; as well as mixtures thereof.

In some embodiments, the curing unit comprises an infrared source. In such embodiments, curing the condensed or deposited precursor comprises exposing the precursor to infrared radiation.

In some embodiments, the curing unit comprises an ultraviolet (UV) radiation source. In such embodiments, curing the condensed or deposited precursor comprises exposing the precursor to ultraviolet radiation.

In some embodiments, the substrate is exposed to a curing ambient, in other words a curing gas, during exposure to infrared or ultraviolet radiation. Suitable curing ambients include nitrogen, hydrogen, noble gasses such as He, Ne, and Ar; as well as mixtures thereof.

In some embodiments, the curing unit comprises a remote plasma source. In such embodiments, curing the condensed or deposited precursor can comprise exposing the precursor one or more excited species. Examples of excited species include electromagnetic radiation, ions, and radicals.

In some embodiments, the curing unit comprises a remote plasma source and one or more mesh plates are positioned between the remote plasma source and the substrate support. In such embodiments, electromagnetic radiation and ions can be advantageously at least partially blocked by the one or more mesh plates whereas radicals can pass through relatively unhindered. Thus, in such embodiments, curing the condensed or deposited precursor comprises exposing the precursor to radicals.

The remote plasma may be generated using any suitable plasma gas. Suitable plasma gasses include nitrogen, hydrogen, noble gasses such as He, Ne, and Ar; as well as mixtures thereof.

In some embodiments, the curing unit comprises a microwave source. In such embodiments, curing the condensed or deposited precursor can comprise exposing the condensed or deposited precursor to microwave energy.

In some embodiments, the precursor comprises a boron precursor. Thus, a boron-containing layer can be formed on the substrate.

In some embodiments, the boron precursor comprises boron and nitrogen. In some embodiments, the boron precursor comprises boron, nitrogen, and hydrogen.

In some embodiments, the precursor can be represented by a chemical formula according to formula (i)

(i)

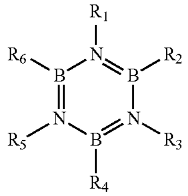

wherein $R_1$, $R_2$, $R_3$, $R_4$, $R_5$, and $R_6$ are independently selected from H, $NH_2$, alkyl, and a halogen.

In some embodiments, at least one of $R_1$, $R_2$, $R_3$, $R_4$, $R_5$, and $R_6$ is F or Cl.

In some embodiments, the precursor is borazine.

In some embodiments, the precursor comprises a boron precursor and curing the precursor comprises exposing the condensed or deposited precursor to a reactant. In some embodiments, the reactant contains nitrogen. Additionally or alternatively, the reactant can comprise a noble gas. Exposing the condensed or deposited precursor to a reactant can be advantageously done while exposing the substrate to a direct plasma, while exposing the substrate to a reactive species, while exposing the substrate to radicals, while exposing the substrate to ultraviolet (UV) radiation, and/or while exposing the substrate to infrared (IR) radiation.

In some embodiments, the boron precursor comprises a boron halide. For example, the boron precursor can be selected from boron chloride, boron bromide, and boron iodide.

In some embodiments, the boron precursor comprises a boron hydride. Suitable boron hydrides include diborane and decaborane.

In some embodiments, the boron precursor comprises an organoboron, i.e., a compound comprising boron, carbon, and hydrogen. Suitable organoboron compounds include triethylborane.

In some embodiments, the boron precursor comprises an alkylaminoborane. Suitable alkylaminoboranes include tris (methylamino)borane.

In some embodiments, the boron precursor comprises ammonia borane (NH3·BH3).

In some embodiments, the precursor comprises a boron precursor and a silicon precursor. Thus, in some embodiments, both a boron precursor and a silicon precursor are condensed or deposited on the substrate. In some embodiments, the silicon precursor comprises a silicon halide. In some embodiments, the silicon halide comprises silicon, hydrogen, and fluorine. In some embodiments, the silicon halide comprises silicon, hydrogen, and chlorine. In some embodiments, the silicon halide comprises silicon, hydrogen, and bromine. In some embodiments, the silicon halide comprises silicon, hydrogen, and iodine. In some embodiments, the silicon halide is selected from tetrachlorosilane, diiodosilane, and tetraiodosilane. Thus, a layer comprising silicon and boron, can be formed on the substrate. In some embodiments, the In some embodiments, the precursor comprises a boron precursor and a silicon precursor, and the boron precursor comprises boron and nitrogen. For example, the precursor can comprise borazine or an alkyl-substituted derivative thereof. In such embodiments, a silicon-doped boron nitride layer can be formed on the substrate by first depositing or condensing the silicon precursor and the boron precursor on the substrate, and then curing the silicon precursor and the boron precursor.

In some embodiments, the precursor comprises a boron precursor and a silicon precursor, the boron precursor comprises boron and a halide, the silicon precursor comprises silicon and a halide, and the step of curing comprises generating a nitrogen-containing plasma in the reaction chamber. Thus, a silicon-doped boron nitride layer can be formed on the substrate. In an exemplary embodiment, the boron precursor comprises $BBr_3$, the silicon precursor comprises $SiI_2H_2$, and generating the direct nitrogen-containing plasma in the reaction chamber comprises providing $N_2$ and optionally $H_2$ to the reaction chamber.

In some embodiments, curing the condensed or deposited precursor by means of the curing unit comprises providing a reactant to the reaction chamber. In some embodiments, the reactant contains silicon. In some embodiments, the reactant comprises a silicon halide, such as at least one of a silicon and fluorine containing compound, a silicon and chlorine containing compound, and a silicon and bromine containing compound. In some embodiments, the silicon halide is selected from tetrachlorosilane and tetraiodosilane. In some embodiments, the silicon halide comprises a compound selected from $SiH_3Cl$, $SiH_2Cl_2$, $SiH_3Cl$, and $SiCl_4$. In some embodiments, the silicon halide comprises a compound selected from $SiBr_4$, $SiHBr_3$, $SiH_2Br_2$, $SiH_3Br$, and $SiBr_4$. In some embodiments, the silicon halide comprises a compound selected from $SiH_3I$, $SiH_2I_2$, $SiH_3I$, and $SiI_4$. Thus, a layer comprising silicon, e.g. a silicon-doped boron nitride layer, can be formed on the substrate.

In some embodiments, the presently described methods comprise a plurality of deposition cycles. A deposition cycle comprises a precursor pulse and a curing pulse. A precursor pulse comprises providing the precursor to the reaction chamber as described herein. The curing pulse comprising curing the condensed or deposited precursor as described herein. Optionally, the precursor pulse and the curing pulse are separated by an intra-cycle purge. Additionally or alternatively, subsequent deposition cycles can, in some embodiments, be separated by an inter-cycle purge.

In some embodiments, the method comprises heating the walls of the reaction chamber by means of a reaction chamber wall heater. Thus, the sticking coefficient of gasses on the reactor walls can be controlled, and precursor deposition or condensation on the reaction chamber walls can be avoided or reduced. Any chamber wall heater can be used including, but not limited to, wall heaters comprising one or more resistive heating elements or wall heaters comprising one or more pipes comprising a heating fluid.

In some embodiments, the reaction chamber is maintained at a pressure of at least $1.10^{-11}$ mbar to at most 1 bar, or at a pressure of at least $1.10^{-10}$ mbar to at most $1.10^{-1}$ bar, or at a pressure of at least $1.10^{-9}$ mbar to at most 1 mbar, or at a pressure of at least $1.10^{-8}$ mbar to at most $1.10^{-2}$ mbar, or at a pressure of at least $1.10^{-7}$ mbar to at most $1.10^{-4}$ mbar.

FIG. 1 shows an embodiment of a system (100) as disclosed herein. The system (100) can be used in certain embodiments of methods as described herein. The system (100) comprises a reaction chamber (120). The reaction chamber (120) comprises a lower conductive flat-plate electrode (122), and an upper conductive flat-plate electrode (121). The lower flat-plate electrode (121) suitably serves as a substrate support. The upper conductive flat-plate electrode (121) can suitably serve as a gas injector, i.e., as a showerhead injector, for providing one or more reaction gasses, e.g. precursors and/or reactants, to the reaction chamber (120). The one or more reaction gasses can be provided from one or more precursor sources, e.g. a first precursor source (112), to the upper conductive flat-plate electrode (121) by means of one or more gas lines, e.g. by means of a first gas line (111). Unused reaction gasses, carrier gasses, reaction products, and the like can be removed from the reaction chamber (120) by means of an exhaust (124). Optionally, the system (110) comprises one or more additional gas inlets (126) for providing further gasses to the reaction chamber (120).

The lower conductive flat-plate electrode (122) that serves as a substrate support comprises a cooling element and a heating element. The upper conductive flat-plate electrode (121) serving as showerhead injector comprises a showerhead heating element. The precursor source (112) comprises a first gas source heating element, and the first gas line (111) is provided with a first gas line heating element. The various heating elements are not shown in FIG. 1 for clarity. Thus a temperature profile can be maintained in the system (100). In particular, the upper conductive flat-plate electrode (121) can be maintained at a temperature which is higher than the temperature of the first gas line (111), the first gas line (111) can be maintained at a temperature which is higher than the temperature of the first precursor source (112), and the lower conductive flat-plate electrode (122) can be maintained at a temperature which is lower than the temperature of the first precursor source (112). Thus, precursor can be efficiently deposited or condensed on a substrate located on the lower conductive flat-plate electrode (122) while precursor condensation or deposition is avoided or at least minimized in the first gas line (111) and on the upper conductive flat-plate electrode (121).

Disposed in the reaction chamber (120), and in particular substantially between the lower flat-plate electrode (121) and the upper conductive flat-plate electrode (121), is a reaction zone (123). In the reaction zone (123), reactive species can be formed by means of a plasma. The plasma can be generated by operationally connecting an RF power source (131), i.e., an electrical power source that produces electrical power in the form of an alternating current with a frequency in the radio frequency (RF) range, with the upper flat plate electrode (122), and by grounding the lower flat-plate electrode (121) by means of an electrical ground (133).

Alternatively (embodiment not shown), a plasma can be generated in the reaction zone by operationally connecting an RF power source to the lower flat plate electrode, and by grounding the upper flat-plate electrode by means of an electrical ground.

The system (100) further comprises a controller (not shown) that can comprise electronic circuitry and software to selectively operate the RF power source, valves, manifolds, heaters, pumps and other components included in the system (100). Such circuitry and components operate to introduce precursors, reactants, and/or purge gases from their respective sources. In some embodiments, the controller can control timing of gas pulse sequences, temperature of the substrate and/or reaction chamber, pressure within the reaction chamber, and various other operations to provide proper operation of the system (100). The controller can include modules such as software or hardware components, e.g., a FPGA or ASIC, which perform certain tasks. A module can advantageously be configured to reside on the addressable storage medium of the controller and be configured to execute one or more processes. Various configurations of the system are possible, including various numbers and kinds of precursor sources, plasma gas sources, and purge gas sources.

Figure 2:
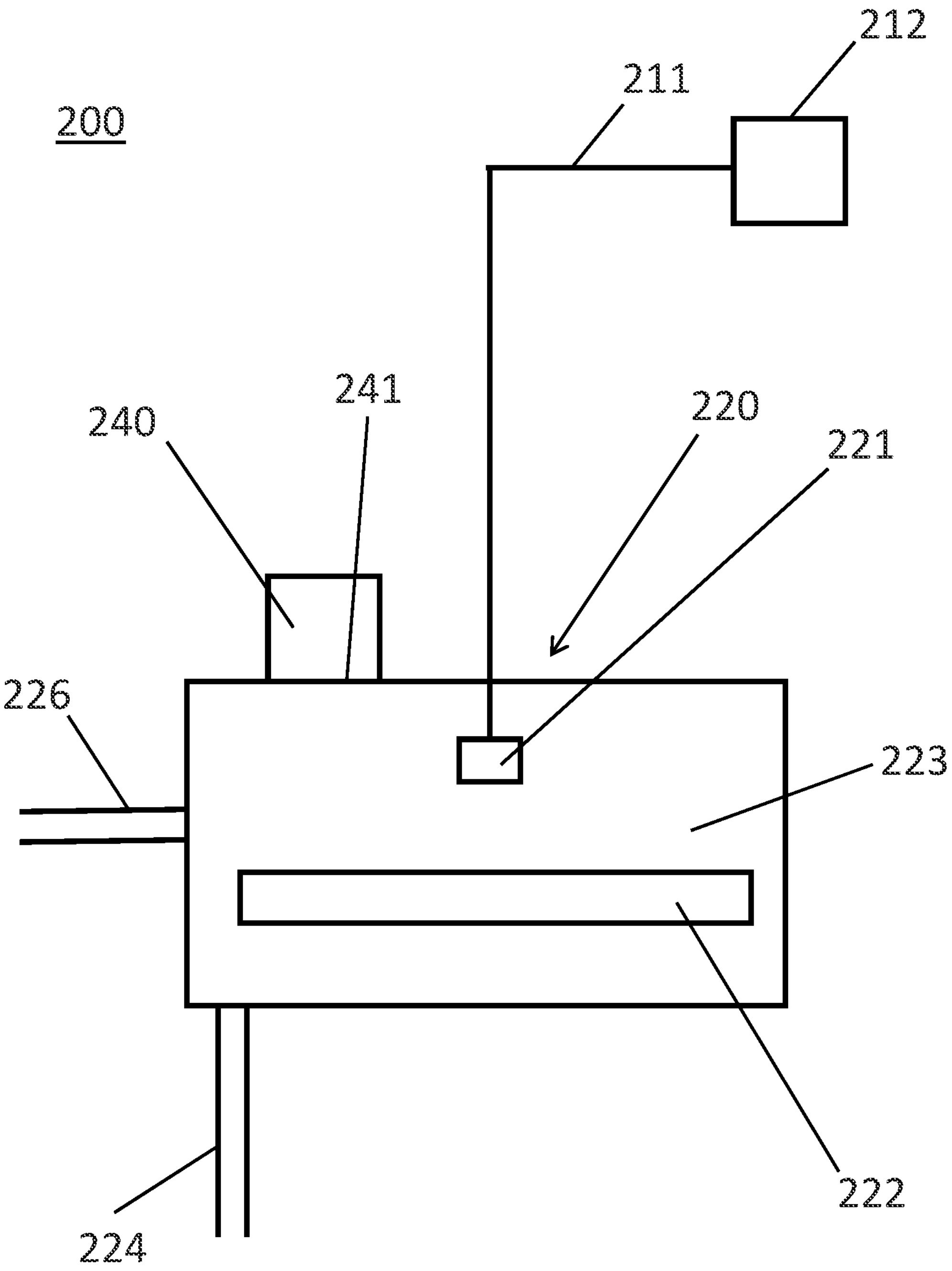
FIG. 2 shows another embodiment of a system (200) as disclosed herein.

FIG. 2 shows another embodiment of a system (200) as disclosed herein. The system (200) can be used in certain embodiments of methods as described herein. The system (200) comprises a reaction chamber (220). The reaction chamber (220) comprises a substrate support (222) and a gas injector (221) for providing one or more reaction gasses, e.g. precursors and/or reactants, to the reaction chamber (220). Suitable injectors include showerhead injectors, nozzles, injection lances, and the like. The one or more reaction gasses can be provided from one or more precursor sources, e.g. a first precursor source (212), to the injector (222) by means of one or more gas lines, e.g. by means of a first gas line (211). Unused reaction gasses, carrier gasses, reaction products, and the like can be removed from the reaction chamber (220) by means of an exhaust (224). Optionally, the system (200) comprises one or more additional gas inlets (226) for providing further gasses to the reaction chamber (220).

The substrate support (222) comprises a cooling element and a heating element. The precursor source (212) comprises a first gas source heating element, and the first gas line (211) is provided with a first gas line heating element. The various heating elements are not shown in FIG. 1 for clarity. Thus a temperature profile can be maintained in the system (200). In particular, the injector (221) can be maintained at a temperature which is higher than the temperature of the first gas line (211), the first gas line (211) can be maintained at a temperature which is higher than the temperature of the first precursor source (212), and the substrate support (222) can be maintained at a temperature which is lower than the temperature of the first precursor source (212). Thus, precursor can be efficiently deposited or condensed on a substrate located on the substrate support (222) while precursor condensation or deposition is avoided or at least minimized in the first gas line (211) and on the injector (221).

The system (200) further comprises a radiation source (240) which is operationally coupled to the reaction chamber (220). Suitable radiation sources (240) include ultraviolet lamps and infrared lamps and as such are known in the Art. A radiation source (240) can be separated from the reaction chamber (220) by means of a transparent window (241). It shall be understood that the window (241) need only be at least partially transparent to radiation generated by the radiation source (240), and not to other types of radiation. Optionally, the window (241) is heated. Providing a heated window (241) can suitably avoid or reduce precursor deposition or condensation on the window (241), thereby avoiding e.g. particle issues or the need for frequent preventive maintenance.

The system (200) further comprises a controller (not shown) that can comprise electronic circuitry and software to selectively operate the radiation source (240), valves, manifolds, heaters, pumps and other components included in the system (200). Such circuitry and components operate to introduce precursors, reactants, and/or purge gases from their respective sources. In some embodiments, the controller can control timing of gas pulse sequences, temperature of the substrate and/or reaction chamber, pressure within the reaction chamber, and various other operations to provide proper operation of the system (200). The controller can include modules such as software or hardware components, e.g., a FPGA or ASIC, which perform certain tasks. A module can advantageously be configured to reside on the addressable storage medium of the controller and be configured to execute one or more processes. Various configurations of the system are possible, including various numbers and kinds of precursor sources, plasma gas sources, and purge gas sources.

Figure 3:
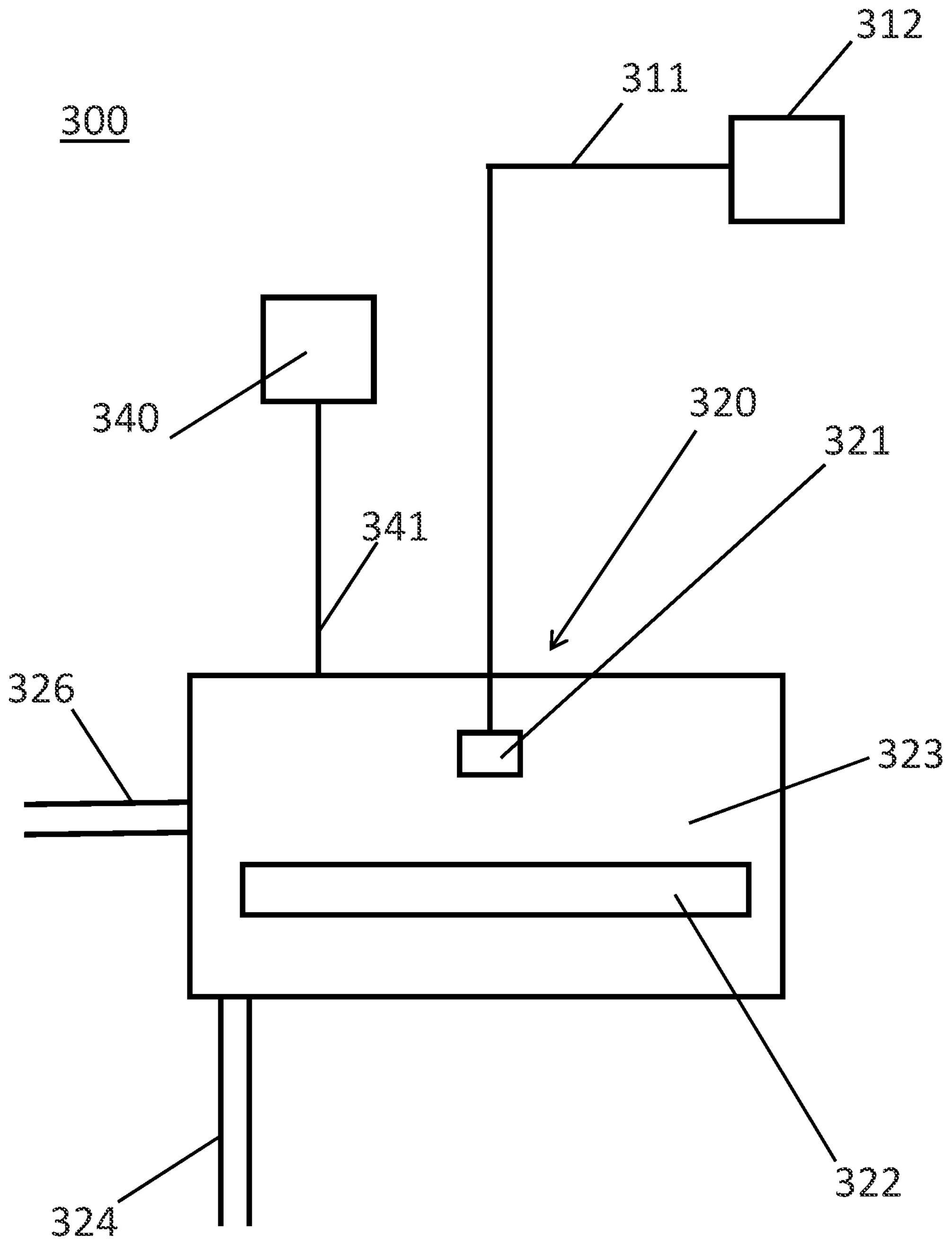
FIG. 3 shows another embodiment of a system (300) as disclosed herein.

FIG. 3 shows another embodiment of a system (300) as disclosed herein. The system (300) can be used in certain embodiments of methods as described herein. The system (300) is similar to the system (200) of FIG. 2; and the system (300) of FIG. 3 comprises a reaction chamber (320) comprising a substrate support (322) and a gas injector (321), a first precursor source (312), a first gas line (311), an exhaust (324), a controller, and optionally one or more additional gas inlets (326). Instead of a radiation source, the system (300) of FIG. 3 comprises a remote plasma source (340) which is operationally coupled to the reaction chamber (320). Suitable remote plasma sources (340) as such are known in the Art, and comprise inductively coupled plasma sources, microwave plasma sources, and capacitive plasma sources. A remote plasma source can be positioned adjacent to the reaction chamber, or the remote plasma source can be positioned at a certain distance from the reaction chamber, e.g. at a distance of at least 1.0 m to at most 10.0 m. When the remote plasma source (340) is positioned at a certain distance from the reaction chamber (320), the remote plasma source (340) can be operationally connected to the reaction chamber (320) via an active species duct (341). The active species duct can comprise a pipe. Optionally, the pipe can contain one or more mesh plates. The mesh plates can at least partially block some reactive species such as ions and electromagnetic radiation while letting other reactive species, e.g. radicals, pass.

It shall be understood that a system according to any one of FIGS. 1 to 3 can comprise additional precursor sources and reactant sources. Some or all of these additional precursor sources and additional reactant sources may be maintained at a temperature which is higher than the substrate support temperature, and lower than the gas injection system temperature, e.g. lower than the temperature of the gas lines and/or injectors.

Figure 4:
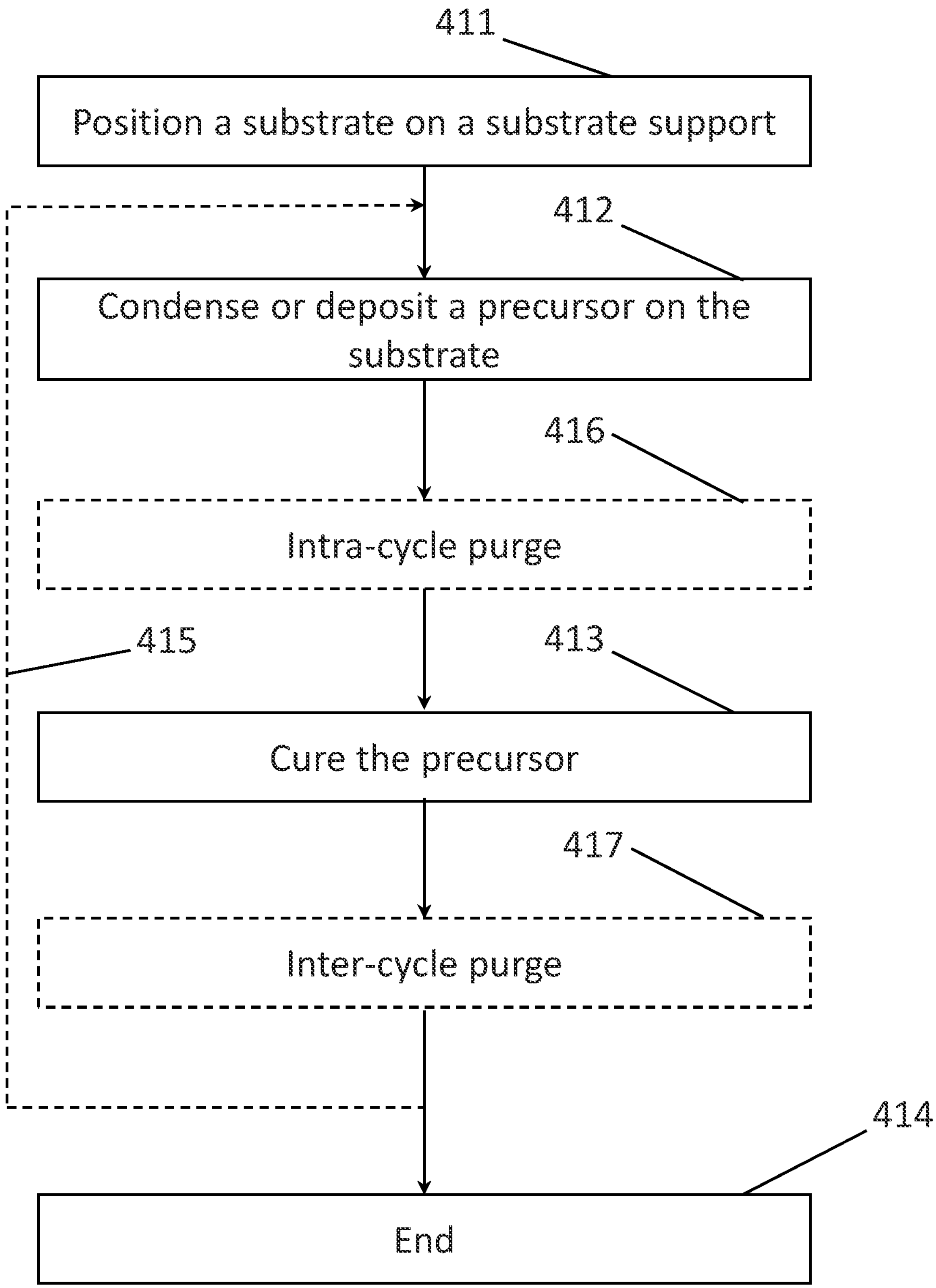
FIG. 4 illustrates an embodiment of a method for forming a layer on a substrate as described herein.

FIG. 4 illustrates an embodiment of a method for forming a layer on a substrate as described herein. The method employs a system as described herein and comprises positioning a substrate on a substrate support (411). Then, the method comprises cyclically executing one or more cycles (415), e.g. a plurality of cycles, e.g. 2, 5, 10, 20, 50, 100, 200, 500, 1000, 2000, 5000 or more cycles. A cycle comprises the following steps, in the following order: a step of condensing or depositing a precursor on the substrate (412), and a step of curing the precursor (413). Optionally, the step of condensing or depositing a precursor on the substrate (412) and the step of curing the precursor can be separated by an intra-cycle purge (416). Additionally or alternatively, subsequent cycles can, in some embodiments, be separated by an inter-cycle purge (417). This cyclical deposition process results in the deposition of a material, i.e., a layer, on the substrate. The amount of material deposited on the substrate depends on the amount of cycles (415) which are executed. After a suitable amount of material has been deposited, the method ends (414). At least during the step of depositing or condensing the precursor on the substrate, the substrate is maintained at a temperature below the temperature of the precursor source, as described elsewhere herein.

In some embodiments, the step of curing the precursor (413) comprises exposing the substrate to electromagnetic radiation. Suitable examples of electromagnetic radiation comprise ultraviolet light, visible light, and infrared light. Alternatively, and in some embodiments, the step of curing the precursor (413) comprises exposing the substrate to a remote plasma. Alternatively, and in some embodiments, the step of curing the precursor (413) can comprise generating a direct plasma in the reaction chamber. In some embodiments, the direct plasma is continuously on throughout the step of curing the precursor (413). In some embodiments, the direct plasma is pulsed, i.e. the direct plasma is intermittently turned on and off a plurality of times.

In an exemplary embodiment of a method according to FIG. 4, borazine is used as a precursor to form a boron nitride containing layer. In such an exemplary embodiment, the susceptor can be maintained at a temperature of 21° C., the precursor source can be maintained at a temperature of 40° C., the injector can be maintained at a temperature of 60° C., and gas lines bringing precursor from the precursor source to the injector have a temperature that gradually increases from the precursor source to the injector. Thus, borazine can be condensed on the substrate. Then, the thusly condensed borazine can be cured by means of a technique as described herein.

Figure 5:
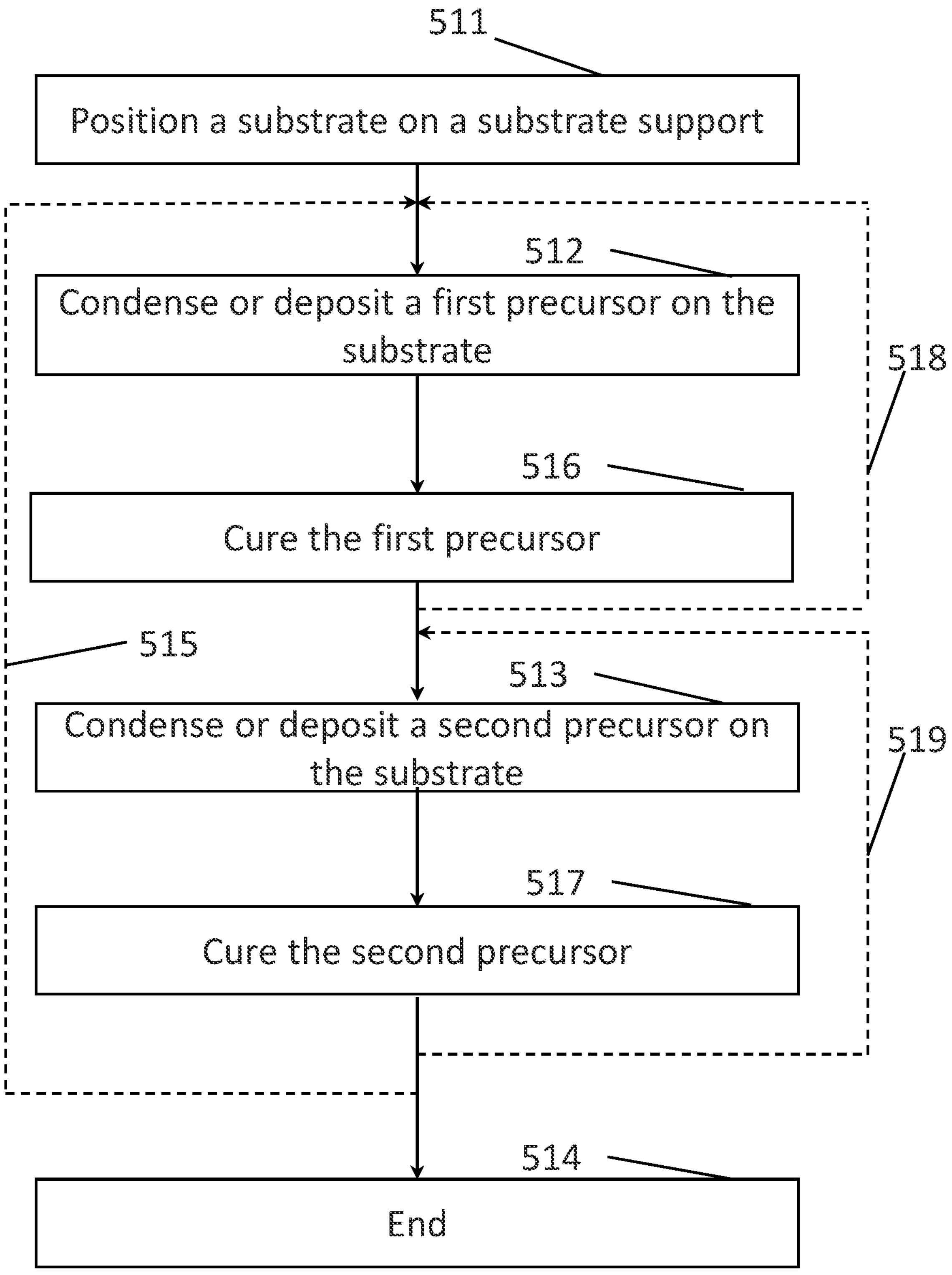
FIG. 5 illustrates another embodiment of a method for forming a layer on a substrate as described herein.

FIG. 5 illustrates another embodiment of a method for forming a layer on a substrate as described herein. The method employs a system as described herein and comprises positioning a substrate on a substrate support (511). Then, the method comprises cyclically executing one or more first cycles (518), e.g. a plurality of first cycles, e.g. 2, 5, 10, 20, 50, 100, 200, 500, 1000, 2000, 5000 or more first cycles. A first cycle comprises a step (512) of condensing or depositing a first precursor on the substrate, and a step (516) of curing the first precursor. Optionally, the step of condensing or depositing the first precursor on the substrate (512) and the step (516) of curing the first precursor can be separated by a purge. After the first cycles (518) have been executed, the method comprises cyclically executing one or more second cycles (519), e.g. a plurality of second cycles, e.g. 2, 5, 10, 20, 50, 100, 200, 500, 1000, 2000, 5000 or more second cycles. Optionally the first cycles (518) and the second cycles (519) are separated by a purge. A second cycle comprises a step (513) of condensing or depositing a second precursor on the substrate, and a step (517) of curing the second precursor. Optionally, the step of condensing or depositing the second precursor on the substrate (513) and the step (517) of curing the second precursor can be separated by a purge. Optionally, the first cycles (518) and the second cycles (519) can be repeated one or more times in a super cycle (515). Optionally, subsequent super cycles (515) are separated by a purge. At least during the steps of depositing or condensing the first precursor on the substrate and depositing or condensing the second precursor on the substrate, the substrate is maintained at a temperature below the temperature of the first precursor source, and below the temperature of the second precursor source, as described elsewhere herein.

This cyclical deposition process results in the formation of a layer, on the substrate. The layer comprises one or more first sub-layers and one or more second sub-layers. The first sub-layer comprises an element comprised in the first precursor, and the second sub-layer comprises an element comprised in the second precursor. It shall be understood that the first precursor and the second precursor are different. Thus, the presently described methods can result in the formation of a super-lattice comprising alternating first sub-layers and second sub-layers. Alternatively, intermixing between the first sub-layers and the second sub-layers may occur, either during the presently described methods, or during a subsequent process step, such as an anneal.

In some embodiments, the first precursor comprises a boron precursor as described herein. In some embodiments, the second precursor comprises a silicon precursor as described herein. When the first precursor comprises a boron precursor and the second precursor comprises a silicon precursor, a layer containing boron and silicon can be suitably formed. When the first precursor comprises boron and nitrogen, and the second precursor comprises silicon, a silicon-doped boron nitride layer can be suitably formed.

In some embodiments, at least one of the step of curing the first precursor (512) and the step of curing the second precursor (517) comprises exposing the substrate to electromagnetic radiation. Suitable examples of electromagnetic radiation comprise ultraviolet light, visible light, and infrared light. Alternatively, and in some embodiments, at least one of the step of curing the first precursor (512) and the step of curing the second precursor (517) comprises exposing the substrate to a remote plasma. Alternatively, and in some embodiments, at least one of the step of curing the first precursor (512) and the step of curing the second precursor (517) can comprise generating a direct plasma in the reaction chamber. In some embodiments, the direct plasma is continuously on throughout at least one of the step of curing the first precursor (512) and the step of curing the second precursor (517). In some embodiments, the direct plasma is pulsed, i.e. the direct plasma is intermittently turned on and off a plurality of times.

Figure 6:
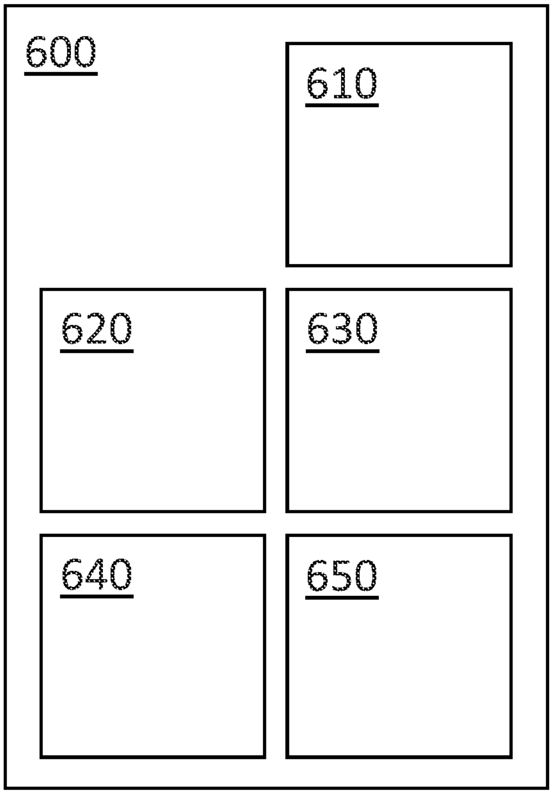
FIG. 6 shows an embodiment of a controller (600) for use in a system as described herein.

FIG. 6 shows an embodiment of a controller (600) for use in a system as described herein. The controller comprises a gas flow control unit (610), a precursor source temperature control unit (620), a gas injection system temperature control unit (630), a substrate support temperature control unit (640), and a curing unit control unit (650). The operation of suitable controllers (600) is described elsewhere herein.

The example embodiments of the disclosure described herein do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

In the present disclosure, where conditions and/or structures are not specified, the skilled artisan in the art can readily provide such conditions and/or structures in view of the present disclosure, as a matter of routine experimentation.

The invention claimed is:

1. A system comprising:

a reaction chamber, the reaction chamber comprising a substrate support, the substrate support comprising a substrate cooling unit;

a precursor source for introducing a precursor in the reaction chamber via a gas injection system fluidly coupled to the reaction chamber, the precursor source comprising a precursor source heater;

a gas injection system heater arranged for heating the gas injection system; and, a curing unit; and a controller comprising:

a gas injection system temperature control unit arranged to maintain the gas injection system at a pre-determined gas injection system temperature, the gas injection system temperature being higher than a precursor source temperature;

a substrate support temperature control unit arranged to maintain the substrate support at a pre-determined substrate support temperature, the substrate support temperature being lower than the precursor source temperature; and a curing unit control unit arranged for controlling the operation of the curing unit, wherein the curing unit is configured to cure condensed or deposited precursor.

2. The system according to claim 1 wherein the gas injection system comprises a showerhead injector, the showerhead injector comprising a showerhead injector heater.

3. The system according to claim 2 wherein the curing unit comprises:

a lower electrode and an upper electrode, the lower electrode being comprised in the substrate support, the upper electrode being comprised the showerhead injector; and a radio frequency power source arranged for generating a radio frequency power waveform, the radio frequency power source being electrically connected to one of the lower electrode and the upper electrode.

4. The system according to claim 1 wherein the curing unit comprises one or more of an infrared source, a UV source, a microwave source, and a remote plasma source.

5. The system according to claim 1 wherein the curing unit comprises a remote plasma source and wherein one or more mesh plates are positioned between the remote plasma source and the substrate support.

6. The system according to claim 1, the controller further comprising:

a gas flow control unit arranged to control gas flow into the gas injection system.

7. The system according to claim 1 wherein the reaction chamber further comprises a substrate heating unit that is comprised in the substrate support.

8. The system according to claim 1 wherein the precursor comprises a boron precursor and wherein curing the condensed or deposited precursor comprises exposing the precursor to a reactant.

9. The system according to claim 1 wherein the controller is further configured to:

maintain a second precursor source at a second precursor source temperature;

provide the second precursor, from the second precursor source, via the gas injection system, to the reaction chamber, thus condensing or depositing the second precursor on the substrate to form a condensed or deposited second precursor; and cure the condensed or deposited second precursor by means of the curing unit.

10. The system according to claim 1 wherein the controller further comprises a precursor source temperature control unit arranged to maintain the precursor source at a predetermined precursor source temperature.

11. The system according to claim 1 wherein the controller is further configured to maintain the precursor source at the precursor source temperature.

12. The system according to claim 1 wherein the controller is further configured to position a substrate on the substrate support.

13. The system according to claim 1 wherein the controller is further configured to provide a precursor, from the precursor source, via the gas injection system, to the reaction chamber, thus condensing or depositing the precursor on the substrate to form the condensed or deposited precursor.

* * * * *